US007772869B2

(12) United States Patent
Lee et al.

(10) Patent No.: US 7,772,869 B2
(45) Date of Patent: Aug. 10, 2010

(54) DISPLAY DEVICE AND METHOD FOR TESTING THE SAME

(75) Inventors: Myung-Woo Lee, Seoul (KR); Joo-Hyung Lee, Gwacheon-si (KR); Sang-Jin Pak, Yongin-si (KR); Kee-Han Uh, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 949 days.

(21) Appl. No.: 11/546,108

(22) Filed: Oct. 10, 2006

(65) Prior Publication Data

US 2007/0120789 A1 May 31, 2007

(30) Foreign Application Priority Data

Nov. 30, 2005 (KR) ...................... 10-2005-0115652

(51) Int. Cl.
*G01R 31/00* (2006.01)
*G09G 3/36* (2006.01)
*H04N 17/00* (2006.01)
*G06F 3/041* (2006.01)

(52) U.S. Cl. ........................... 324/770; 345/87; 345/98; 345/173; 345/904; 348/177; 348/180

(58) Field of Classification Search ................. 324/770; 345/87–100, 173–174, 207, 904; 348/177, 348/180–181
See application file for complete search history.

(56) References Cited

U.S. PATENT DOCUMENTS 5,528,267 A 6/1996 Ise
6,100,865 A * 8/2000 Sasaki ......................... 345/92
6,720,791 B2 * 4/2004 Cheng et al. ................ 324/770
6,784,862 B2 8/2004 Kodate et al.
2002/0044208 A1 * 4/2002 Yamazaki et al. ........... 348/272
2002/0140650 A1 * 10/2002 Kai et al. ...................... 345/87
2003/0075718 A1 * 4/2003 Jang et al. ..................... 257/72
2003/0140650 A1 * 7/2003 Kentner et al. ................ 62/474
2004/0056845 A1 3/2004 Harkom et al.

(Continued)

FOREIGN PATENT DOCUMENTS

JP 2005-122209 5/2005

(Continued)

OTHER PUBLICATIONS

English Language Abstract, JP Patent First Publication No. 2005-227409, Aug. 25, 2005, 1 page.

(Continued)

*Primary Examiner*—David L Lewis
*Assistant Examiner*—Matthew A Fry
(74) *Attorney, Agent, or Firm*—Innovation Counsel LLP

(57) ABSTRACT

A method of economically manufacturing display devices having a matrix of drivable pixels arranged in rows and columns arranged to be driven by IC drivers, including the steps of including a plurality of sensor signal lines in the display device that are selectively connectable to certain of the pixel rows, a plurality of sensor signal lines selectively connectable to certain of the pixel columns, transmitting test signals to test predetermined ones of the rows and columns of pixels, and connecting pixel driving circuits to those display devices exhibiting uniform pixel brightness in response to the test signals.

14 Claims, 10 Drawing Sheets

U.S. PATENT DOCUMENTS

| | | | | |
|---|---|---|---|---|
| 2004/0150629 | A1 | 8/2004 | Lee | |
| 2004/0189567 | A1* | 9/2004 | Kimura | 345/87 |
| 2005/0046439 | A1* | 3/2005 | Yu | 324/770 |
| 2006/0132463 | A1* | 6/2006 | Lee et al. | 345/173 |
| 2006/0146035 | A1* | 7/2006 | Cha et al. | 345/173 |
| 2006/0284646 | A1* | 12/2006 | Shimizume et al. | 324/770 |
| 2007/0109239 | A1* | 5/2007 | den Boer et al. | 345/87 |
| 2007/0120790 | A1* | 5/2007 | Jeon | 345/87 |

FOREIGN PATENT DOCUMENTS

| | | |
|---|---|---|
| JP | 2005-196737 | 7/2005 |
| JP | 2005-227409 | 8/2005 |
| KR | 1020040095047 | 11/2004 |
| KR | 1020050065971 | 6/2005 |
| KR | 1020050082042 | 8/2005 |

OTHER PUBLICATIONS

English Language Abstract, KR Patent First Publication No. 1020050082042, Aug. 22, 2005, 1 page.

English Language Abstract, JP Patent First Publication No. 2005-196737, Jul. 21, 2005, 1 page.

English Language Abstract, KR Patent First Publication No. 1020050065971, Jun. 30, 2005, 1 page.

English Language Abstract, JP Patent First Publication No. 2005-122209, May 12, 2005, 1 page.

English Language Abstract, KR Patent First Publication No. 1020040095047, Nov. 12, 2004, 1 page.

* cited by examiner

DISPLAY DEVICE AND METHOD FOR TESTING THE SAME

CROSS-REFERENCE TO RELATED APPLICATION

This application claims priority to and the benefit of Korean Patent Application No. 10-2005-0115652 filed in the Korean Intellectual Property Office on Nov. 30, 2005, the entire contents of which are incorporated herein by reference.

FIELD OF THE INVENTION

The present invention relates to a display device and a method for testing the same.

DESCRIPTION OF THE RELATED ART

Liquid crystal displays (LCDs) typically include a pair of panels that are provided with pixel electrodes and a common electrode, as well as a liquid crystal layer with dielectric anisotropy interposed between the two panels. The pixel electrodes are usually arranged in a matrix pattern and are connected to switching elements, such as thin film transistors (TFTs) in order to receive image data voltages row by row. The common electrode covers the entire surface of one of the two panels and is supplied with a common voltage. A pixel electrode and corresponding portions of the common electrode and corresponding portions of the liquid crystal layer form a liquid crystal capacitor that, along with a switching element connected thereto, is the basic element of a pixel.

An LCD generates electric fields by applying voltages to pixel electrodes and a common electrode, the strength of the electric fields applied being varied to adjust the transmittance of light passing through the liquid crystal layer, thereby displaying images.

Touch screen panels are used with LCDs to permit writing or drawing by the touch of a finger, pen, or stylus to a display panel. However, the manufacturing costs of the LCDs that incorporate touch screen panels are high compared to the costs of LCDs that do not employ touch screen panels. Furthermore, the process used in attaching the touch screen panel to the LCD causes a reduction in yield and luminance, as well as an increase in the thickness of the LCD.

For solving the above problems, a plurality of sensing units, which are implemented with thin film transistors, may be integrated into pixels displaying images of the LCD. The sensing unit senses the variation of light incident upon the display panel when touched by a finger or an implement. Usually only a visual inspection can be made of the sensing units implemented with thin film transistors. However, no inspection is usually made during the manufacturing process of the sensing signal generator connected to the sensing units and the sensing signal is not output so that defects are not detected.

SUMMARY OF THE INVENTION

An exemplary embodiment of the present invention provides a display device, which includes a plurality of first display signal lines, a plurality of second display signal lines intersecting the first display signal lines, a plurality of pixels connected to one of the first display signal lines and one of the second display signal lines, respectively, a plurality of first sensor signal lines respectively disposed at predetermined pixel rows (hereinafter referred to as "a pixel row group") and parallel to the first display signal lines, a plurality of second sensor signal lines respectively disposed at predetermined pixel columns (hereinafter referred to as "a pixel column group") and parallel to the second display signal lines, a plurality of first sensor signal output units respectively connected to the first sensor signal lines, a plurality of second sensor signal output units respectively connected to the second sensor signal lines, a plurality of first inspection switching elements respectively connected to the first display signal lines, a plurality of second inspection switching elements respectively connected to the second display signal lines, a first inspection line for transmitting a test signal from the outside to the first inspection switching elements, and a second inspection line for transmitting the test signal to the second inspection switching elements, wherein the first inspection switching elements connected to the first display signal lines included in the same pixel row group are connected to the same first sensor signal output unit, and the second inspection switching elements connected to the second display signal lines included in the same pixel column group are connected to the same second sensor signal output unit.

The first inspection line may include an inspection pad for receiving the test signal.

The display device may further include a signal line connected to the inspection pad and transmitting a driving voltage and a first output pad connected to the signal line.

The display device may further include a driving chip electrically connected to the second display signal lines, the first sensor signal lines, and the second sensor signal lines.

The first output pad is connected to the driving chip, and the driving voltage turns off the first inspection switching elements and the second inspection switching elements.

The display device may further include at least one of third inspection lines being spaced apart from the first display signal lines, the second display signal lines, and the pixels, and transmitting the test signal to the second display signal lines, wherein the third inspection line may include inspection pads for receiving the test signal.

At least one third inspection line may include two third inspection lines, and the two third inspection lines may be disposed alternately with the second display signal lines.

The display device may further include a cutting line for cutting a connection between the second display signal lines and the third inspection lines.

The display device may further include a first driving chip electrically connected to the second display signals and a second driving chip electrically connected to the first sensor signal lines and the second sensor signal lines.

The display device may further include a second output pad connected to the first inspection line and transmitting the driving voltage.

The second output pad may be connected to the second driving chip, and the driving voltage may turn the first switching inspection elements and the second inspection switching elements off.

The display device may further include at least one the third inspection line being spaced apart from the first display signal lines, the second display signal lines, and the pixels and transmitting the test signal to the second display signal lines, and the third inspection line comprises inspection pads for receiving the test signal.

The at least one third inspection line may include two third inspection lines, and the two third inspection lines are alternately disposed with the second display signals.

The display device may further include a cutting line for cutting a connection between the second display signals and the third inspection lines.

Each of the first sensor signal output units and the second sensor signal output units may include a first reset transistor supplied with a first reset voltage and a first reset control signal, an output transistor connected to the first reset transistor and the first inspection switching element or the second inspection switching element, and the second reset transistor supplied with a second reset voltage and a second reset control signal and connected to the output transistor.

Another embodiment of the present invention provides a method for testing a display device, which includes a plurality of first display signal lines, a plurality of second display signal lines, a plurality of pixels connected to the first display signal lines and the second display signal lines, a plurality of first sensor signal lines disposed for each predetermined number of pixel rows, a plurality of second sensor signal lines disposed for each predetermined number of pixel columns, a plurality of first sensor signal output units connected to the first sensor signal lines, a plurality of second sensor signal output units connected to the second sensor signal lines, a plurality of first switching elements for inspecting connections to the first display signal lines, a plurality of second inspection switching elements for inspecting connections to the second display signal lines, a first inspection line for transmitting a test signal from the outside to the first inspection switching elements, and a second inspection line for transmitting the test signal to the second inspection switching elements, wherein each of the first and second sensor signal output units comprises a first reset transistor, an output transistor connected to the first reset transistor, and a second reset transistor connected to the output transistor, the method including driving the first reset transistor and an output transistor, driving pixels by applying a test signal to the first inspection line and the second inspection line and applying a signal from the output transistor to the first display signals and the second display displays through the first and second inspection switching elements, stopping the driving of the first reset transistor, driving the second reset transistor, and driving pixels by applying a test signal to the first inspection line and the second inspection line and applying a signal from the output transistor to the first display signal lines and the second display signal lines through the first and second inspection switching elements.

BRIEF DESCRIPTION OF THE DRAWINGS

The present invention will become more apparent by describing preferred embodiments thereof in detail with reference to the accompanying drawings, in which.

DETAILED DESCRIPTION OF THE EMBODIMENTS

Figure 1:
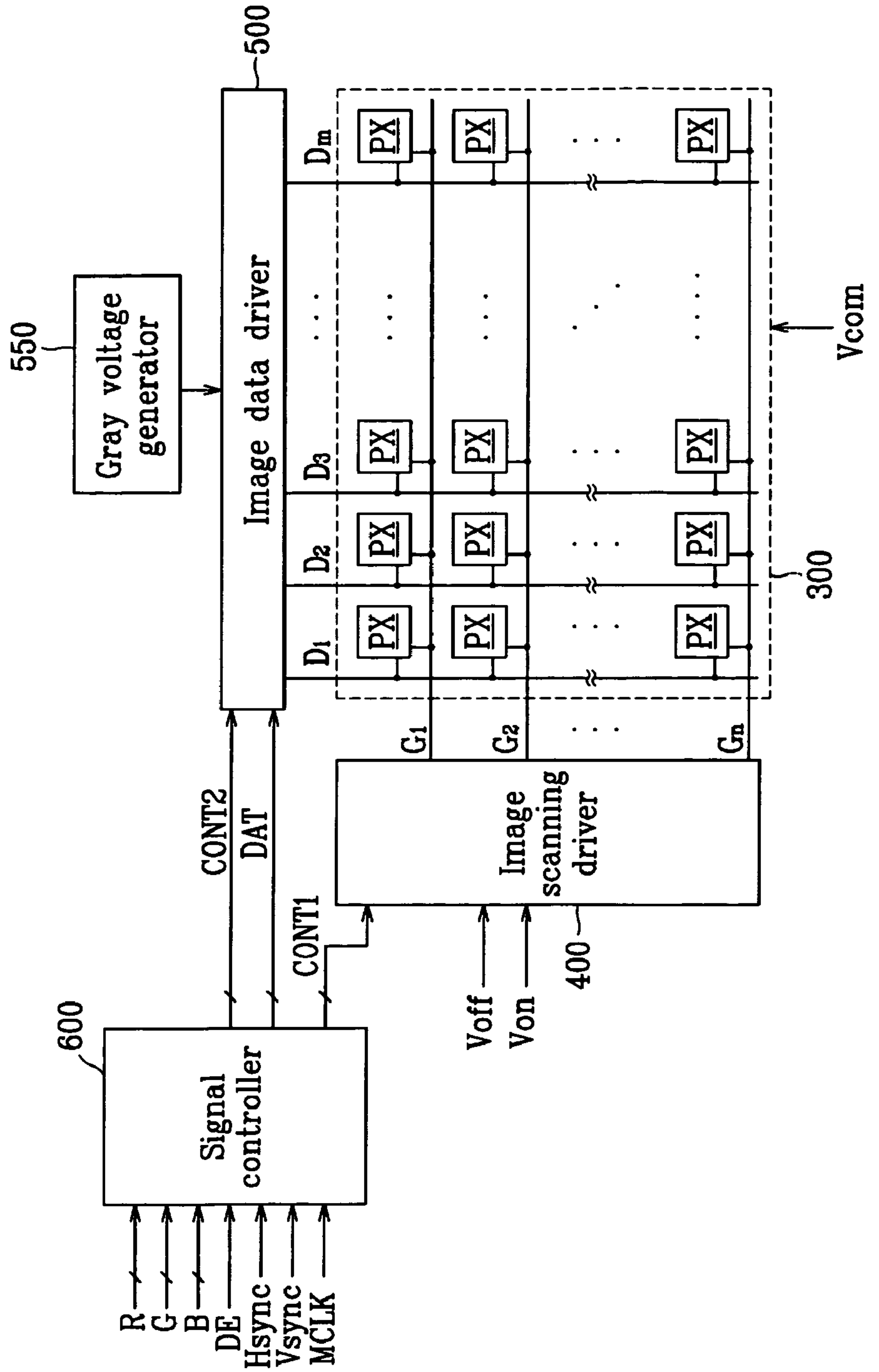
FIG. 1 is a block diagram of an LCD showing pixels according to an exemplary embodiment of the present invention.

In the drawings, the thickness of layers and regions are exaggerated for clarity. Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected.

Figure 3:
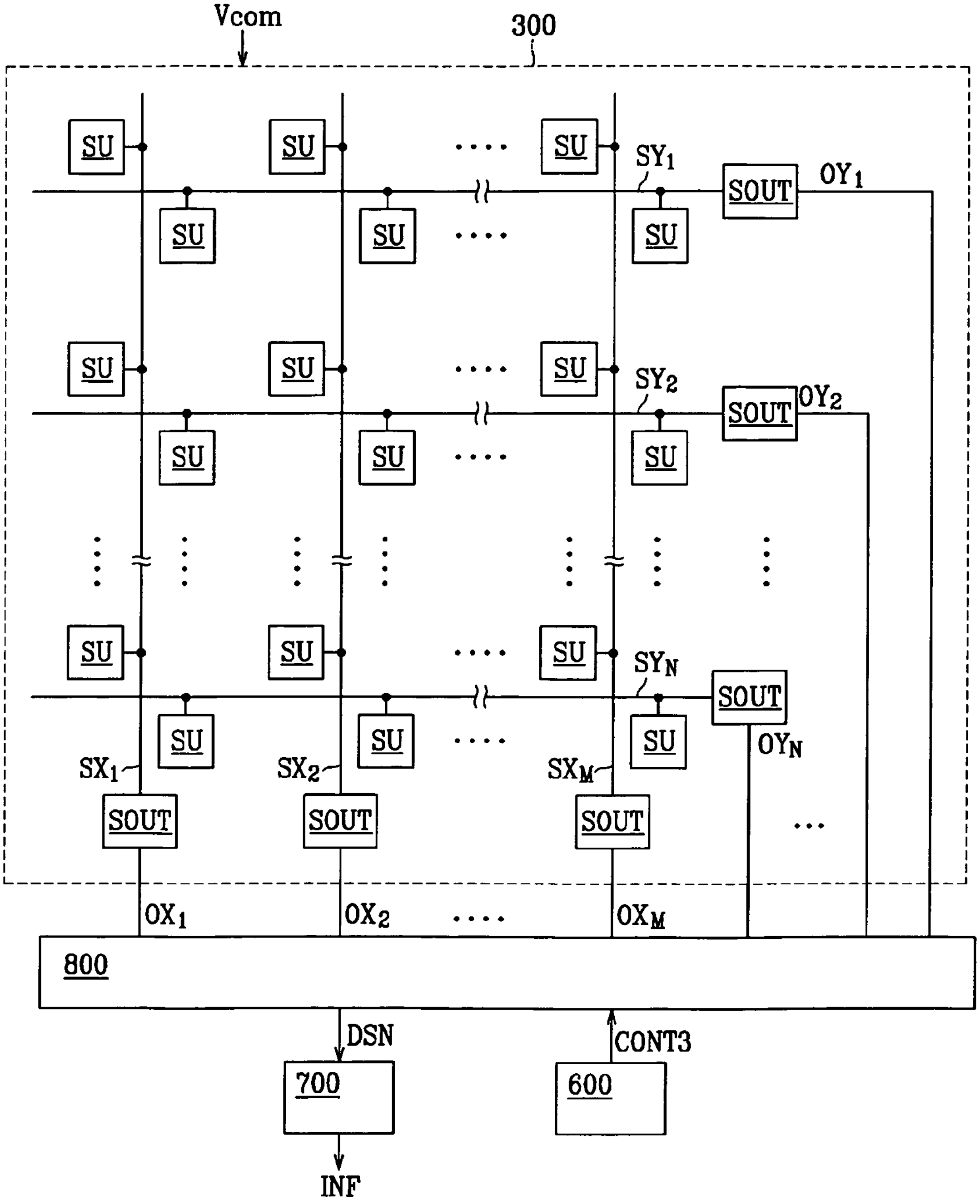
FIG. 3 is a block diagram of an LCD showing sensing units according to an exemplary embodiment of the present invention.

As shown in FIGS. 1 and 3, an LCD according to an exemplary embodiment of the present invention includes a liquid crystal (LC) panel assembly 300, an image scanning driver 400, an image data driver 500, a sensing signal processor 800, a gray voltage generator 550 coupled to the image data driver 500, a contact determiner 700 coupled to the sensing signal processor 800, and a signal controller 600 for controlling the above-referenced elements as described further herein.

Referring to FIGS. 1 to 5, the LC panel assembly 300, in an equivalent circuital view, includes a plurality of signal lines $G_1$-$G_n$ and $D_1$-$D_m$, a plurality of pixels PX, a plurality of sensor signal lines $SY_1$-$SY_N$, $SX_1$-$SX_M$, and RL, and a plurality of sensing units SU, a plurality of sensor signal output units SOUT connected to the sensor signal lines $SY_1$-$SY_N$ and $SX_1$-$SX_M$, respectively, and a plurality of output data lines $OY_1$-$OY_N$ and $OX_1$-$OX_M$. The pixels PX are connected to the signal lines $G_1$-$G_n$ and $D_1$-$D_m$ and are arranged substantially in a matrix, and the sensing units SU are connected to the sensor signal lines $SY_1$-$SY_N$, $SX_1$-$SX_M$, and RL and are arranged substantially in a matrix.

Figure 2:
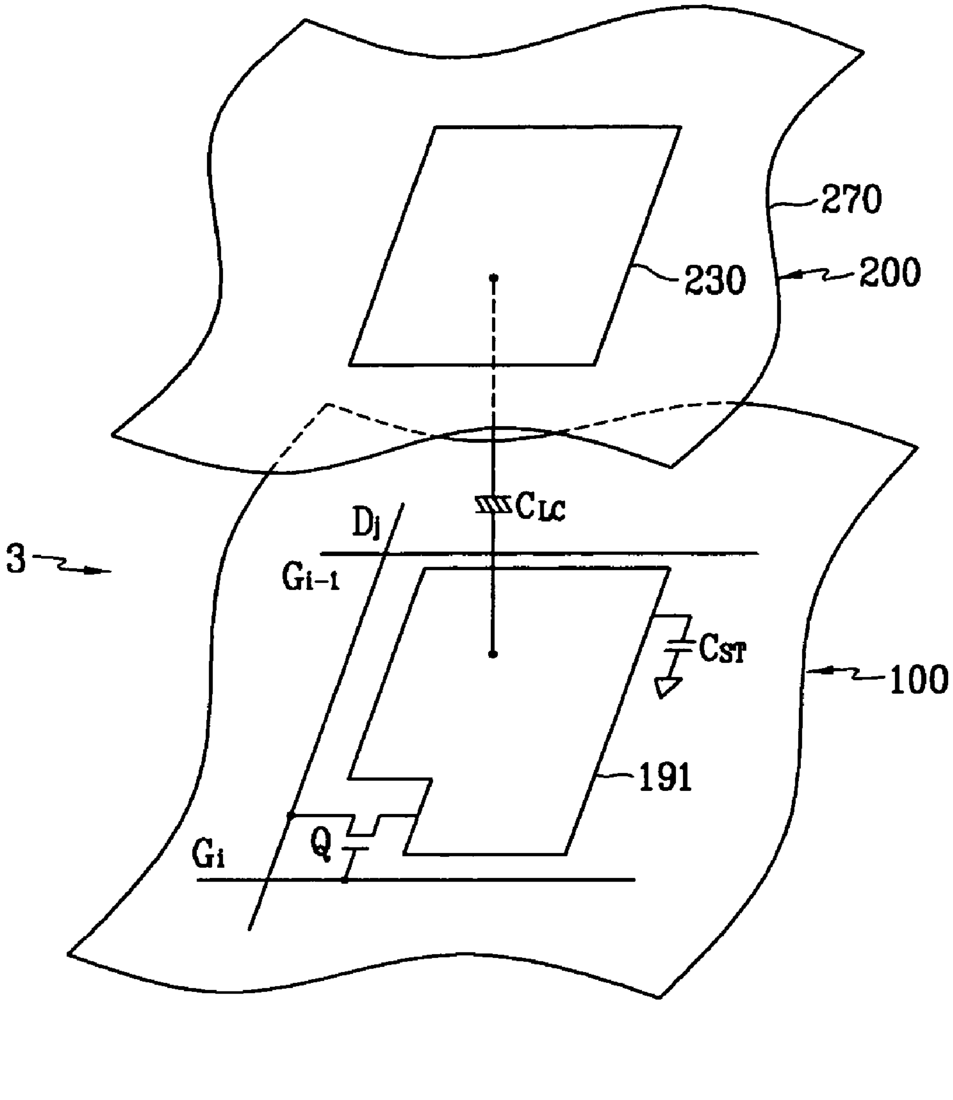
FIG. 2 is an equivalent circuit diagram of a pixel of an LCD according to an exemplary embodiment of the present invention.
Figure 6:
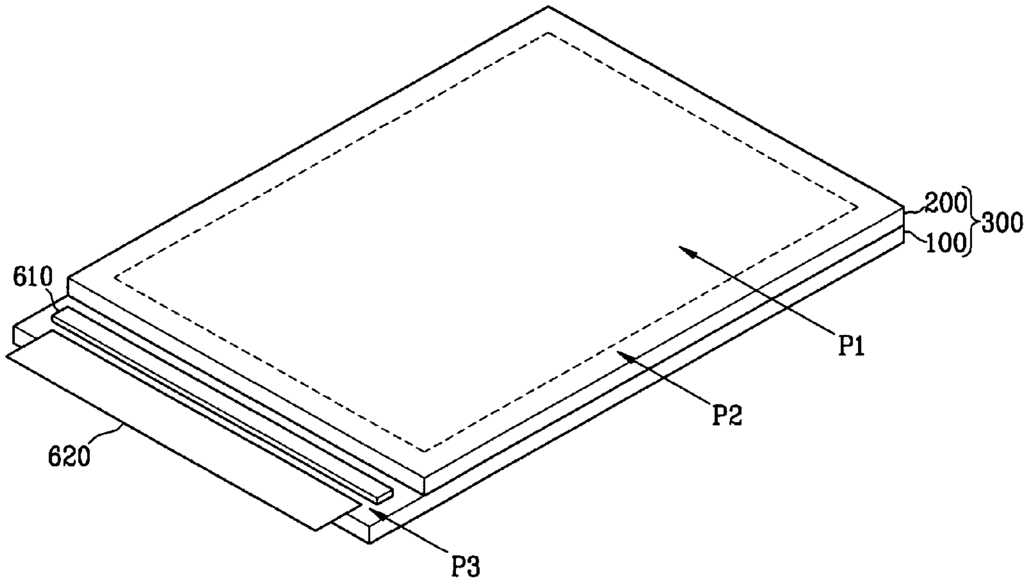
FIG. 6 is a schematic diagram of an LCD according to an exemplary embodiment of the present invention.

The panel assembly 300, in a structural view shown in FIGS. 2 and 6, includes a thin film transistor array panel 100, a common electrode panel 200, a liquid crystal layer 3 interposed therebetween, and a plurality of spacers (not shown). The spacers form a gap between the panels 100 and 200 and are transformed by pressure applied from the outside.

The signal lines $G_1$-$G_n$ and $D_1$-$D_m$ include a plurality of image scanning lines $G_1$-$G_n$ for transmitting image scanning signals and a plurality of image data lines $D_1$-$D_m$ for transmitting image data signals. The sensor signal lines $SY_1$-$SY_N$, $SX_1$-$SX_M$, and RL include a plurality of horizontal and vertical sensor scanning lines $SY_1$-$SY_N$ and $SX_1$-$SX_M$ for transmitting sensor data signals and a plurality of reference voltage lines RL for transmitting reference voltages. The reference voltage lines RL may be omitted if necessary.

As shown in FIGS. 1 and 3, the image scanning lines $G_1$-$G_n$ and the horizontal sensor data lines $SY_1$-$SY_N$ extend substantially in a row direction and are substantially parallel to each other, while the image data lines $D_1$-$D_m$ and the vertical sensor data lines $SX_1$-$SX_M$ extend substantially in a column direction and are substantially parallel to each other. The reference lines RL extend substantially in the row direction or in the column direction.

Referring to FIG. 2, each pixel PX, for example a pixel PX in the i-th row (i=1, 2, . . . , n) and the j-th column (j=1, 2, . . . , m), is connected to signal lines $G_i$ and $D_j$ and includes a switching element Q connected to the signal lines $G_1$-$G_n$ and $D_1$-$D_m$, and an LC capacitor $C_{LC}$ and a storage capacitor $C_{ST}$ that are connected to the switching element Q. However, it will be understood that the storage capacitor $C_{ST}$ may be omitted.

The switching element Q, such as a TFT, is provided on the lower panel 100 and has three terminals: a control terminal connected to one of the image scanning lines $G_1$-$G_n$; an input terminal connected to one of the image data lines $D_1$-$D_m$; and an output terminal connected to the LC capacitor $C_{LC}$ and the storage capacitor $C_{ST}$. The TFT may be made of amorphous silicon or poly crystalline silicon.

The LC capacitor $C_{LC}$ includes a pixel electrode 191 provided on the TFT array panel 100 and a common electrode 270 provided on the common electrode panel 200, as two terminals. The LC layer 3 disposed between the two electrodes 191 and 270 functions as a dielectric of the LC capacitor $C_{LC}$. The pixel electrode 191 is connected to the switching element Q, and the common electrode 270 is supplied with a common voltage Vcom and covers an entire surface of the common electrode panel 200. While shown on the common electrode panel 200 in FIG. 2 for illustrative purposes, it will be understood that the common electrode 270 may be provided on the TFT array panel 100, and both electrodes 191 and 270 may have shapes comprising, e.g., bars or stripes.

The storage capacitor $C_{ST}$ is an auxiliary capacitor for the LC capacitor $C_{LC}$. The storage capacitor $C_{ST}$ includes the pixel electrode 191 and a separate signal line (not shown), which is provided on the lower panel 100, overlaps the pixel electrode 191 via an insulator (not shown), and is supplied with a predetermined voltage such as the common voltage Vcom. In alternative embodiments, the storage capacitor $C_{ST}$ includes the pixel electrode 191 and an adjacent image scanning line (one of $G_1$-$G_n$), called a previous image scanning line, which overlaps the pixel electrode 191 via an insulator.

For color display, each pixel PX uniquely represents one of various colors (i.e., spatial division) or each pixel PX sequentially represents the colors (e.g., primary colors) in turn (i.e., temporal division) such that a spatial or temporal sum of the colors is recognized as a desired color. An example of a set of the colors includes primary colors of red, green, and blue. FIG. 2 shows an example of the spatial division in which each pixel PX includes a color filter 230 representing one of the colors in an area of the upper panel 200 facing the pixel electrode 191. In alternative exemplary embodiments, the color filter 230 is provided on or under the pixel electrode 191 on the TFT array panel 100.

One or more polarizers (not shown) are attached to at least one of the panels 100 and 200.

Figure 4:
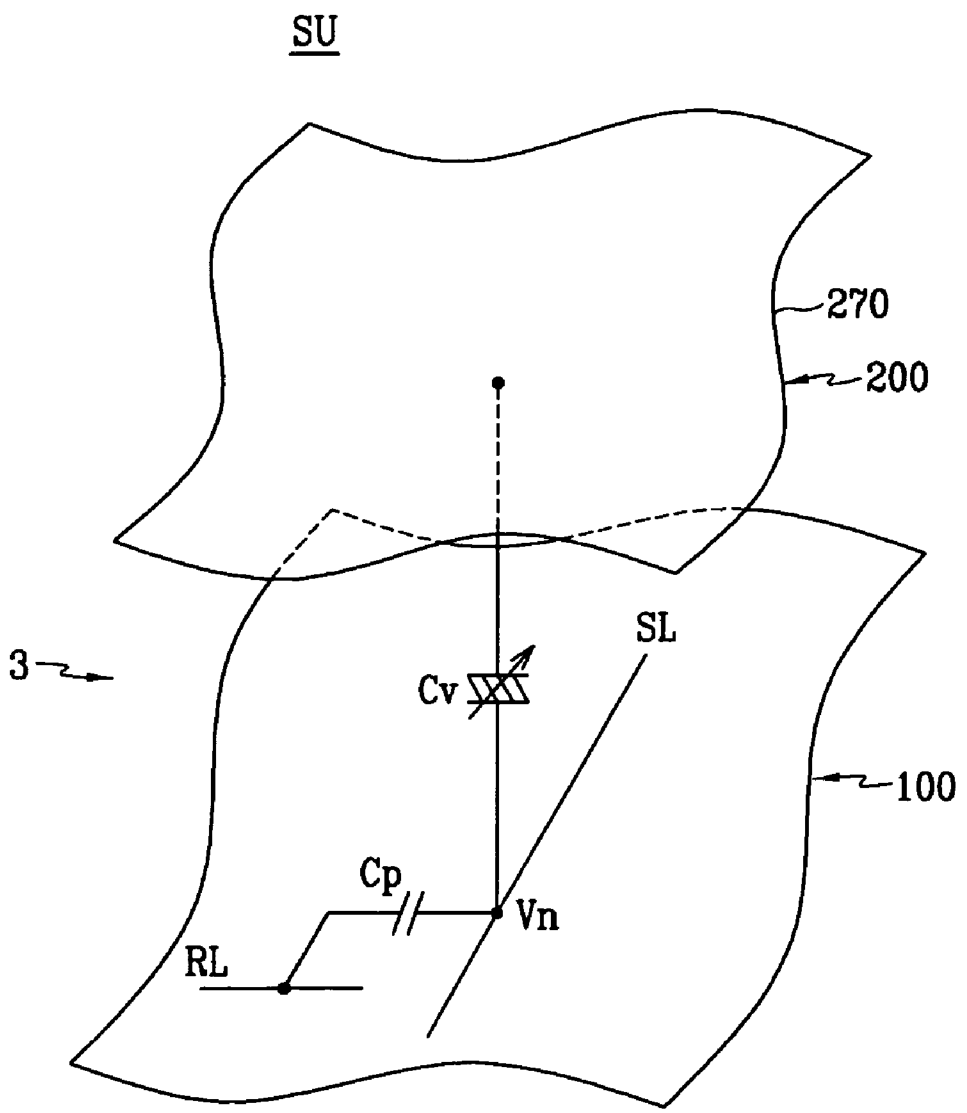
FIG. 4 is an equivalent circuit diagram of a sensing unit of an LCD according to an exemplary embodiment of the present invention.

Referring to FIG. 4, each of the sensing units SU includes a variable capacitor Cv connected to a horizontal or vertical sensor data line that is represented as a drawing reference "SL", and a reference capacitor Cp connected between the sensor data line SL and a reference voltage line RL.

The reference capacitor Cp is formed between the reference voltage line RL of the TFT array panel 100 and the sensor data line SL via an insulator.

The variable capacitor Cv includes the sensor data line SL of the TFT array panel 100 and the common electrode 270 provided on the common electrode panel 200 as two terminals, and an LC layer 3 interposed therebetween, which functions as an insulator. The capacitance of the variable capacitor Cv varies by external stimulus such as the user touching the LC panel assembly 300. An example of the external stimulus is pressure, and when the pressure is applied to the common electrode panel 200, the distance between the two terminals of the variable capacitor Cv varies under the applied pressure, changing the capacitance of variable capacitor Cv.

The variation of the capacitance of the variable capacitor Cv, varies the voltage Vn (referred to as "a touch voltage") at the point of contact between reference capacitor Cp and variable capacitor Cv.

The touch voltage Vn applied to sensor data line SL is a sensor data signal that indicates whether or not contact is made. At this time, since the reference capacitor Cp has a predetermined capacitance and the reference voltage applied to the reference capacitor Cp is also fixed, the touch voltage Vn is varied within a constant range. Thereby, the sensor data signal is varied within the constant range, and whether contact is made, and if so a contact position, are easily determined.

One sensing unit SU is disposed for two adjacent pixels PX. The concentration of a pair of the sensing units SU disposed adjacent to an intersected area of the corresponding sensor data lines $SY_1$-$SY_N$ and $SX_1$-$SX_M$, may be, for example, about ¼ of the concentration of the "dots", where the term "dot" includes a set of different colored pixels PX and is the basic unit for representing color and determining the resolution of the LCD. The set of pixels PX may includes a red pixel, a green pixel, and a blue pixel sequentially arranged in a row. Alternatively, the set of pixels PX may include a red pixel, a green pixel, a blue pixel, and a white pixel.

As an example of the pair of the sensing units SU having about ¼ concentration of the concentration of the dots, concentrations in horizontal and vertical directions of the sensing units SU are about half the concentrations of horizontal and vertical directions of the pixels PX, respectively. In this case, there may be pixel rows and pixel columns without the sensing units SU.

An LCD having the concentration of sensing units SU and dots as above-described may be required in various application fields for high letter recognition and accuracy. The concentration of sensing units SU may be varied if necessary.

By disposing the sensing units SU according to an exemplary embodiment of the present invention, the space occupied by the sensing units SU and the sensor data lines SL may advantageously be lower than the concentration of pixels PX, thereby minimizing the decrementation of the optical aperture.

Figure 5:
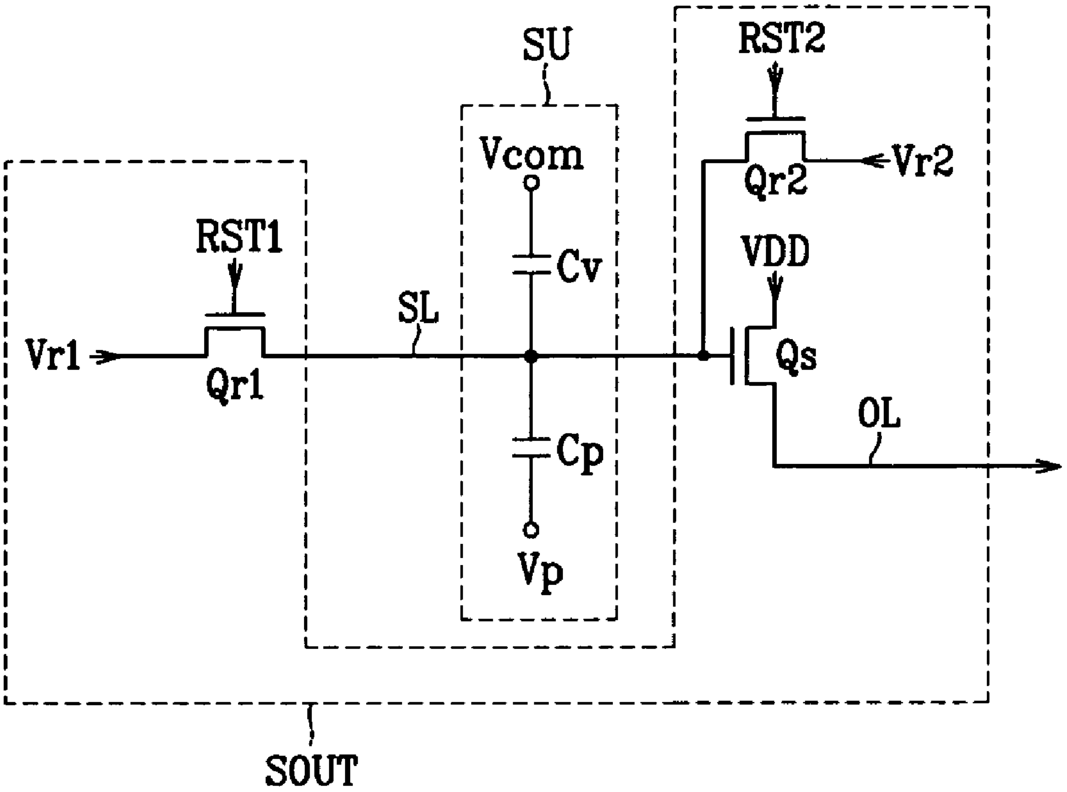
FIG. 5 is a circuit diagram of a sensor signal output unit according to an exemplary embodiment of the present invention.

The sensor signal output units SOUT have substantially similar structure and will be described with reference to FIG. 5. In FIG. 5, for convenience, one sensor signal line SL (in FIG. 3, $SY_1$-$SY_N$, $SX_1$-$SX_M$) is connected to one sensing unit SU, but in reality, it is connected to a plurality of sensing units SU.

Referring to FIG. 5, the sensor signal output unit SOUT includes first and second reset transistors Qr1 and Qr2 and an output transistor Qs. Transistors Qr1, Qr2, and Qs, such as thin film transistors, etc., have three terminals, respectively. That is, the first reset transistor Qr1 has a control terminal connected to reset control signal RST1, an input terminal connected to a reset voltage Vr1, and an output terminal connected to a sensor signal line SL.

The second reset transistor Qr2 has a control terminal connected to a reset control signal RST2, an input terminal connected to a reset voltage Vr2, and an output terminal connected to the sensor signal line SL. Output transistor Qs also has a control terminal connected to the sensor data line SL, an input terminal connected to an input voltage VDD, and an output terminal connected to an output data line OL (in FIG. 3, $OY_1$-$OY_N$, $OX_1$-$OX_M$).

Output data lines $OY_1$-$OY_N$ and $OX_1$-$OX_M$ include a plurality of horizontal and vertical output data lines $OY_1$-$OY_N$ and $OX_1$-$OX_M$ connected to horizontal and vertical sensor data lines through the corresponding sensor signal output units SOUT, respectively.

Output data lines $OY_1$-$OY_N$ and $OX_1$-$OX_M$ are connected to the sensing signal processor 800, and transmit the output signals from the sensor signal output units SOUT to the sensing signal processor 800. The horizontal and vertical output data lines $OY_1$-$OY_N$ and $OX_1$-$OX_M$ extend almost in a longitudinal direction, and are substantially parallel to each other.

Referring again to FIGS. 1 and 3, gray voltage generator 550 generates two sets of gray voltages (or reference gray voltages) related to the transmittance of the pixels. The gray voltages in the first set have a positive polarity with respect to the common voltage Vcom, while the gray voltages in the second set have a negative polarity with respect to the common voltage Vcom.

The image scanning driver 400 in FIG. 1 is connected to the image scanning lines $G_1$-$G_n$ of the panel assembly 300, and synthesizes a first high voltage and a first low voltage to generate the image scanning signals for application to the image scanning lines $G_1$-$G_n$.

Image data driver 500 in FIG. 1 is connected to the image data lines $D_1$-$D_m$ of the panel assembly 300, and applies image data signals selected from the gray voltages to the image data lines $D_1$-$D_m$. However, it will be understood that the image data driver 500 may generate gray voltages for both sets of gray voltages by dividing the reference gray voltages and selecting the data voltages from the generated gray voltages when the gray voltage generator 550 generates reference gray voltages.

As shown in FIG. 3, sensing signal processor 800 is connected to output data lines $OY_1$-$OY_N$ and $OX_1$-$OX_M$ of the LC panel assembly 300, and is provided with the output signals transmitted through the output data lines $OY_1$-$OY_N$ and $OX_1$-$OX_M$. After signal processing such as amplifying, etc., to generate analog sensing signals, the sensing signal processor 800 converts the analog sensing signals into digital sensing signals using an analog-digital converter, etc., to generate digital sensing signals DSN.

Contact determiner 700 is provided with the digital sensing signals DSN from the sensing signal processor 800, processes predetermined operations to determine whether contact is made, and if so, a contact position is output to an external device as contact information. Contact determiner 700 senses the operations of sensing units SU based on the digital sensing signals DSN and control signals applied to the sensing units.

Signal controller 600 controls image scanning driver 400, image data driver 500, gray voltage generator 550, and sensing signal processor 800, etc.

Referring to FIGS. 1 and 3, each of the aforementioned units 400, 500, 550, 600, 700, and 800 may include at least one integrated circuit (IC) chip mounted on the LC panel assembly 300 or on a flexible printed circuit (FPC) film as a tape carrier package (TCP) type, which are attached to the panel assembly 300. In alternative embodiments, at least one of the units 400, 500, 550, 600, 700, and 800 may be integrated with the panel assembly 300 along with the signal lines $G_1$-$G_n$, $D_1$-$D_m$, $SY_1$-$SY_N$, $SX_1$-$SX_M$, $OY_1$-$OY_N$, $OX_1$-$OX_M$, and RL, and the switching elements Q.

Referring to FIG. 6, the LC array panel assembly 300 is divided into a display area P1, a periphery area P2, and exposed area P3. Most of pixels PX, the sensing units SU, and signal lines $G_1$-$G_n$, $D_1$-$D_m$, $SY_1$-$SY_N$, $SX_1$-$SX_M$, and RL are disposed in the display area P. The common electrode panel 200 includes a light blocking member (not shown) such as a black matrix, and the light blocking member substantially covers the periphery area P2 to block light from the outside. In addition, the sensor signal output units SOUT and the output data lines $OY_1$-$OY_N$ and $OX_1$-$OX_M$ are mainly disposed in the periphery area P2.

The size of the common electrode panel 200 is less than that of the TFT array panel 100 such that portions of the TFT array panel 100 are exposed to form the exposed area P3. A single chip 610 is mounted onto the exposed area P3 and a FPC (flexible printed circuit board) substrate 620 is attached thereon.

The chip 610 includes operating units, that is, the image scanning driver 400, the image data driver 500, the gray voltage generator 550, the signal controller 600, the contact determiner 700, and the sensing signal processor 800. The units 400, 500, 550, 600, 700, and 800 may be integrated into the single chip 610 to decrease the occupied size of the units 400, 500, 550, 600, 700, and 800 and consumption power. If necessary, at least one of the units 400, 500, 550, 600, 700, and 800 or at least one circuit element thereof may be located outside of the single IC chip.

The image signal lines $G_1$-$G_n$ and $D_1$-$D_m$ and the output data lines $OY_1$-$OY_N$ and $OX_1$-$OX_M$ extend to the exposed area P3 and are connected to the corresponding units 400, 500, and 800.

The FPC substrate 620 receives signals from an external device and transmits the signals to the single chip 610 or LC panel assembly 300. The FPC substrate 620 mainly has connectors for easily contacting the external device at end portions thereof.

Operation of the LCD will now be described in accordance with exemplary embodiments.

The signal controller 600 is supplied with input image signals R, G, and B and input control signals for controlling the display thereof, from an external graphics controller (not shown). The input image signals R, G, and B contain luminance information of each pixel PX, and the luminance has a predetermined number of grays, for example 1024 ($=2^{10}$), 256 ($=2^8$), or 64 ($=2^6$). The input control signals include a vertical synchronization signal Vsync, a horizontal synchronization signal Hsync, a main clock signal MCLK, a data enable signal DE, etc.

On the basis of the input control signals and the input image signals R, G, and B, the signal controller 600 generates image scanning control signals CONT1, image data control signals CONT2, and sensor data control signals CONT3, and it processes the image signals R, G, and B to be suitable for the operation of the panel assembly 300. The signal controller 600 sends the image scanning control signals CONT1 to the image scanning driver 400, the processed image signals DAT and the image data control signals CONT2 to the image data driver 500, and the sensor data control signals CONT3 to the sensing signal processor 800.

The image scanning control signals CONT1 include an image scanning start signal STV for instructing start of an image scanning operation, and at least one clock signal for controlling the output time of the first high voltage. The image scanning control signals CONT1 may include an output enable signal OE for defining the duration of the first high voltage.

The image data control signals CONT2 include a horizontal synchronization start signal STH for informing of the start of image data transmission for a group of pixels PX, a load signal LOAD for instructing application of the image data signals to the image data lines $D_1$-$D_m$, and a data clock signal HCLK. The image data control signals CONT2 may further include an inversion signal RVS for reversing the polarity of the image data signals (e.g., with respect to the common voltage Vcom).

Responsive to the image data control signals CONT2 from the signal controller 600, the image data driver 500 receives a packet of the digital image data DAT for the group of pixels PX from the signal controller 600, and receives one of the two sets of the gray voltages supplied from the gray voltage generator 550. The image data driver 500 converts the processed image signals DAT into analog image data voltages selected from the gray voltages supplied from the gray voltage generator 550, and applies the image data voltages to the image data lines $D_1$-$D_m$.

The image scanning driver 400 applies a gate-on voltage Von to the image scanning lines $G_1$-$G_n$ in response to receiving the image scanning control signals CONT1 from the signal controller 600, thereby turning on the switching elements Q connected thereto. The image data voltages applied to the image data lines $D_1$-$D_m$ are supplied to the pixels PX through the activated switching elements Q.

The difference between the voltage of an image data signal and the common voltage Vcom is represented as a voltage across the LC capacitor $C_{LC}$, which is referred to as a pixel voltage. The LC molecules in the LC capacitor $C_{LC}$ have orientations depending on the magnitude of the pixel voltage, and the molecular orientations determine the polarization of light passing through the LC layer 3. The polarizer(s) converts light polarization into light transmittance to display images.

By repeating this procedure for each unit of the horizontal period (also referred to as "1H", which is equal to one period of the horizontal synchronization signal Hsync and the data enable signal DE), all image scanning lines $G_1$-$G_n$ are sequentially supplied with the first high voltage, thereby applying the image data signals to all pixels PX to display an image for a frame.

When the next frame starts after one frame finishes, the inversion control signal RVS applied to the image data driver 500 is controlled such that the polarity of the data voltages is reversed (which is referred to herein as "frame inversion"). The inversion control signal RVS may also be controlled such that the polarity of the image data signals flowing in an image data line is periodically reversed during one frame (for example, row inversion and dot inversion), or the polarity of the image data signals in one packet is reversed (for example, column inversion and dot inversion).

The sensing signal processor 800 reads the sensor data signals through the output data lines $OY_1$-$OY_N$ and $OX_1$-$OX_M$ in a porch period between two adjacent frames in accordance with the sensor data control signals CONT3 every frame. This is to decrease the influence of driving signals on sensor data signals from the imager scanning driver 400 and the image data driver 500, etc., such that reliability of the sensor data signals is increased. However, the reading of the sensor data signals by the sensing signal processor 800 is not necessarily performed every frame, and if necessary, it may be performed once for a plurality of frames. Furthermore, the reading of the sensor data signals may be performed twice and more in one porch period.

When a period of reading the sensor data signals by the sensing signal processor 800 ends, the sensor signal output units SOUT transmit the sensor data signals form the sensor data lines $SY_1$-$SY_N$ and $SX_1$-$SX_M$ to the output data lines $OY_1$-$OY_N$ and $OX_1$-$OX_M$.

Operations of the sensor signal output units SOUT will be described with reference to FIG. 7.

Figure 7:
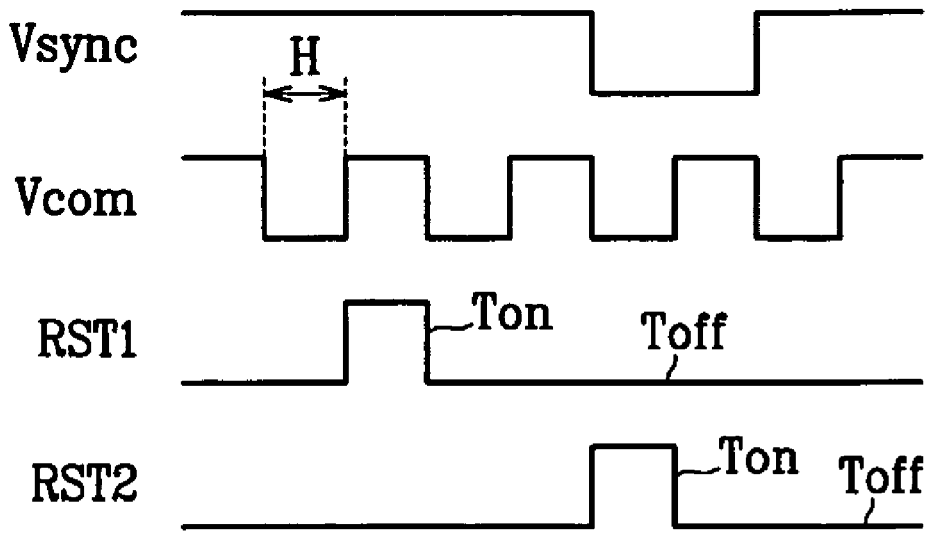
FIG. 7 is a timing chart for a sensing operation of a sensor signal output unit according to an exemplary embodiment of the present invention.

FIG. 7 is a timing chart for the sensing operation of a sensor signal output unit according to an exemplary embodiment of the present invention.

Referring to FIG. 7, an LCD reads sensing signals in the porch period between two adjacent frames as described above, and in particular, preferably in the front porch period before the vertical synchronization signal Vsync.

The common voltage Vcom has a high level and a low level, and swings between the high level and the low level in about 1H.

The first and second reset control signals RST1 and RST2 have a turn-on voltage Ton and a turn-off voltage Toff for turning on and turning off the transistors RST1 and RST2, respectively. The turn-on voltage Ton may be the gate-on voltage Von and the turn-off voltage Toff may be thea gate-off voltage Voff. The turn-on voltage Ton of the first reset control signal RST1 is applied when the common voltage Vcom has a high level.

When reading the sensor signal flowing through the sensor data line SL (in FIG. 3, $SY_1$-$SY_N$, $SX_1$-$SX_M$), the turn-on voltage Ton is applied to the control terminal of the first reset transistor Qr1 to make the first reset transistor Qr1 turn on.

Thereby, the reset voltage Vr1 applied to the input terminal of the first reset transistor Qr1 is applied to the sensor data line SL to initialize the state of the sensor data line SL by the reset voltage Vr1.

After the above-described initializing of the sensor data line SL, the sensor signal output unit SOUT outputs a sensor data signal from the corresponding sensor data line SL.

Then, when the first reset control signal RST1 has a turn-off voltage in synchronization with finishing of the initializing of the sensor data line SL, the state of the sensor data line SL is floated, and thereby a voltage applied to the control terminal of the output transistor Qs is varied based on the capacitance variation of the variable capacitor Cv and the variation of the common voltage Vcom, responsive to whether or not contact occurs.

The current amount of the output transistor Qs is varied on the basis of the variation of the voltage, and thereby the sensing signal having a magnitude defined by the current amount is output through the output data line OL (in FIG. 3, $OY_1$-$OY_N$ and $OX_1$-$OX_M$). Thereby, the sensing signal processor 800 reads the sensing signal applied from the sensor data line SL. The sensor data signal is preferably read within about 1H after the state of the first reset control signal RST1 is changed into the turn-off voltage Toff. That is, the sensing signal is preferably read before the common voltage Vcom has a high level again since the sensing signal is varied by the level variation of the common voltage Vcom.

Since the sensor data signal is varied based on the reset voltage Vr1, the sensor data signal has a constant voltage range, and thereby whether contact occurs, and if so a contact position, are easily determined.

After the sensing signal processor 800 reads the sensing signal, the state of the second reset control signal RST2 is changed from the turn-off voltage Toff to the turn-on voltage Ton to turn on the second reset transistor Qr2. Thereby, the second reset voltage Vr2 is applied to the sensor data line SL. At this time, the state of the second reset voltage Vr2 becomes a ground voltage GND such that the sensor data line SL is reset by the ground voltage GND. The second reset voltage Vr2 is maintained until the next first reset voltage Vr1 is applied to the sensor data line SL. Thereby, since the output transistor Qs maintain the turn-off state until the next first reset voltage Vr1 is applied, power consumption of the output transistor Qs by unnecessary operations decreases.

The turn-on voltage Ton of the first reset control signal RTS1 may be applied when the common voltage Vcom has a low level, and at this time it is preferable that the sensing signal processor 800 reads the sensing signal before the common voltage Vcom has a low level again. Also, the first reset control signal RTS1 may be synchronized with an image scanning signal applied to the final image scanning line $G_n$.

The second reset control signal RTS2 may have a turn-on voltage Ton right next to an approximate 1H or in any subsequent approximate 1H after the sensing signal is read.

Then, the sensing signal processor 800 processes, for example amplifies, etc., the read sensor data signals using an amplifier (not shown) and converts them into digital sensing signals DSN to output to the contact determiner 700.

The contact determiner 700 suitably operates the received digital sensing signals DSN and determines whether contact occurs, and if so, determines a contact position to output the contact information to an external device. The external device transmits the image signals R, G, and B to an LCD based on the contact information from the contact determiner 700.

Next, for the LCD in which the image displaying and the sensing are performed as described, a visual inspecting (VI) method for inspecting states of the sensor signal output units SOUT will be described.

First, referring to FIG. 8, construction of the LC panel assembly for inspecting the states of the sensor signal output units SOUT will be described.

Figure 8:
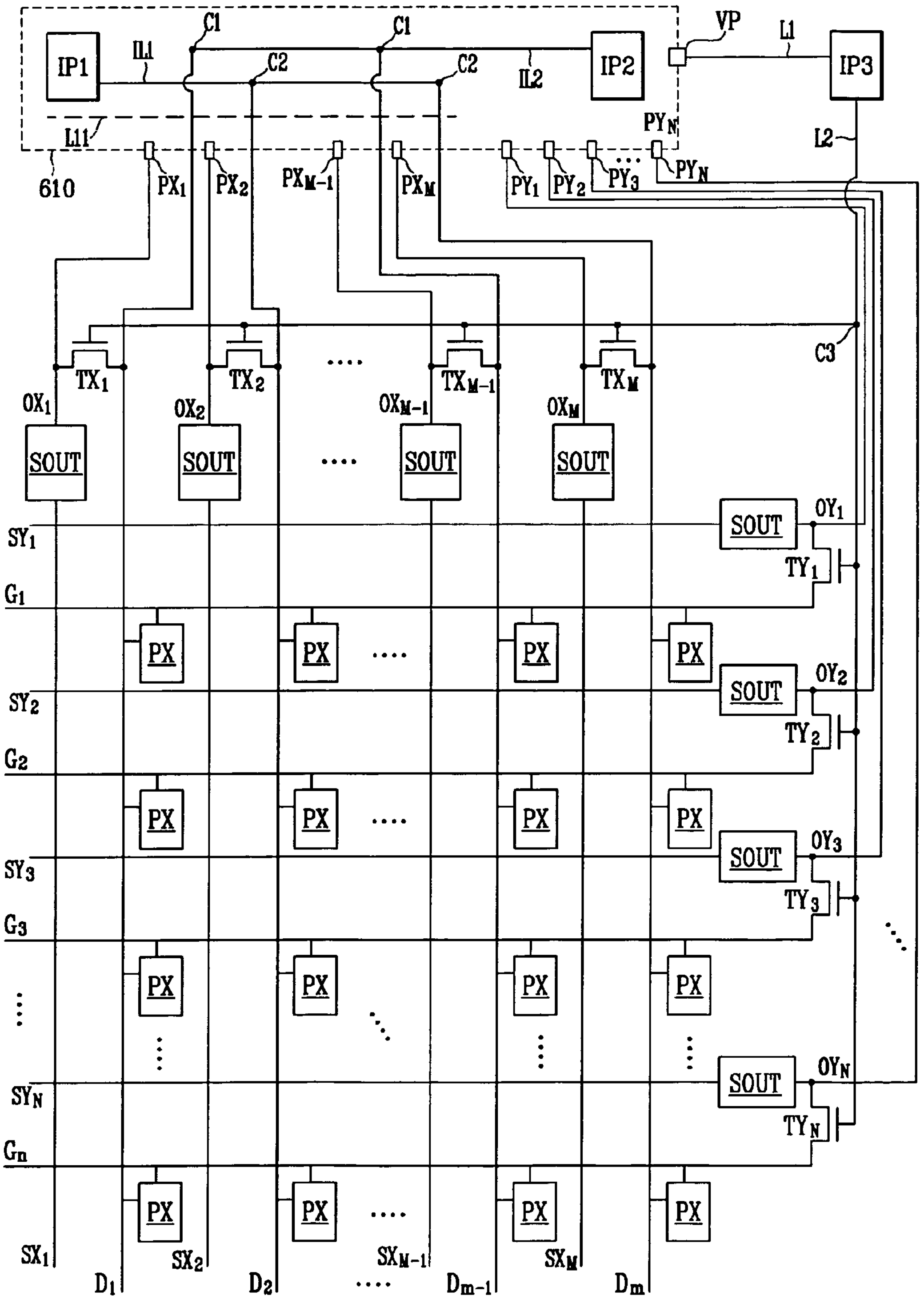
FIG. 8 is a schematic layout view of an LC panel assembly on which a plurality of inspection switching elements, a plurality of inspection lines, and a plurality of inspection pads for inspecting a sensor signal output unit are formed according to an exemplary embodiment of the present invention.

FIG. 8 is a schematic layout view of an LC panel assembly on which a plurality of inspection switching elements, a plurality of inspection lines, and a plurality of inspection pads for inspecting a sensor signal output unit are formed according to an exemplary embodiment of the present invention.

Referring to FIG. 8, an LC panel assembly (not shown) for inspecting states of the sensor signal output units SOUT includes a plurality of inspection switching elements $TY_1$-$TY_N$ and $TX_1$-$TX_M$, a signal line L1, an inspection pad IP3, an inspection lines L2 and L3.

The inspection switching elements $TY_1$-$TY_N$ and $TX_1$-$TX_M$ include the inspection switching elements $TY_1$-$TY_N$ between the output data lines $OY_1$-$OY_N$ and the adjacent image scanning lines $G_1$-$G_n$ and the inspection switching elements $TX_1$-$TX_M$ between the output data lines $OX_1$-$OX_M$ and the adjacent image data lines $D_1$-$D_m$.

That is, each of the switching elements $TY_1$-$TY_N$ includes an input terminal connected to the corresponding output data line $OY_1$-$OY_N$, an output terminal connected to the subsequent image scanning line $G_1$-$G_n$ adjacent thereto, and a control terminal connected to the inspection line L2, and each of the switching elements $TX_1$-$TX_M$ includes an input terminal connected to the corresponding output data line $OX_1$-$OX_M$, an output terminal connected to the subsequent image data line $D_1$-$D_m$ adjacent thereto, and an control terminal connected to the inspection line L2.

The signal line L1 transmits a switching element off voltage Vss from the single chip 610.

The inspection pad IP3 is connected to the signal line L1 and the inspection line L2.

The inspection line L3 is connected to the inspection line L2 through a contact point C3.

In addition, under the single chip 610, inspection lines IL1 and IL2, inspection pads IP1 and IP2, an output pad VP, and a plurality of input pads $PX_1$-$PX_M$ and $PY_1$-$PY_M$ are formed.

The inspection line IL1 is connected to the odd-numbered image data lines $D_1$, $D_3$, . . . through contact points C1, and the inspection line IL2 is connected to the even-numbered image data lines $D_2$, $D_4$, . . . through contact points C2. The inspection pad IP1 is connected to the inspection line IL1 and the inspection pad IP2 is connected to the inspection line IL2.

The output pad VP is connected to the signal line L1 and outputs the switching element off voltage Vss, and the input pads $PY_1$-$PY_N$ and $PX_1$-$PX_M$ are connected to the output data lines $OY_1$-$OY_N$ and $OX_1$-$OX_M$, respectively.

The switching elements $TY_1$-$TY_N$ and $TX_1$-$TX_M$, the signal line L1, the inspection lines L2 and L3, and the inspection pad IP3 are formed on the periphery area P2.

Next, the VI method will be described. Before the inspecting of the sensor signal output units SOUT, the states of the pixels PX, the image scanning lines $G_1$-$G_n$, and image data lines $D_1$-$D_m$ are inspected.

Since the VI methods to the image scanning lines $G_1$-$G_n$ and the image data lines $D_1$-$D_m$ are very similar, the VI method for the image data lines $D_1$-$D_m$ with reference to FIG. 8 will only be described and the VI method for the image scanning lines $G_1$-$G_n$ will be omitted.

In this case, it is assumed that the states of the image scanning lines $G_1$-$G_n$ are normal. After manufacturing the LC panel assembly, a gate-on voltage Von is applied to all the image scanning lines $G_1$-$G_n$ using a test apparatus (not shown) to turn on the switching elements Q of the pixels PX.

The single chip 610 is not mounted on the LC panel assembly.

In this state, when an image data line test signal is applied to the inspection pad IP1 using a probe of the test apparatus, the test signal is transmitted to image data lines, that is, the odd-numbered image data lines $D_1$, $D_3$, . . . through the inspection line IL1 and the contact portion C1.

Thereby, the pixels connected to the image scanning lines supplied with the gate-on voltage Von represent brightness corresponding to a voltage value of the image data test signal.

Subsequently, an inspector examines the display status such as for brightness of pixels by eye to check for disconnection of the image data lines and the operation of the LCD, and then stops the application of the test signal.

Next, when an image data line test signal is applied to the inspection pad IP2 using the probe of the test apparatus, the test signal is transmitted to image data lines, that is, the even-numbered image data lines $D_2$, $D_4$, . . . through the inspection line IL2 and the contact portion C2.

The inspector examines the display status such as for brightness of pixels by eye to check for disconnection of the image scanning lines and image data lines and the operation of the LCD, and then stops the application of the test signal.

When the VI methods for all the image lines $D_1$-$D_m$ are finished, the inspection lines IL1 and IL2 interconnecting the inspection pads IP1 and IP2 and the image data lines $D_1$-$D_m$, respectively, are cut along a cutting line L11 using an appropriate apparatus such as a laser trimming device.

Next, an inspecting method to the sensor signal output units SOUT will be described.

First, operations for inspecting states of the first reset transistors Qr1 and the output transistors Qs of the sensor signal output units SOUT will be described.

Using a test apparatus, voltages of which each has a high level, for example gate-on voltages Von, are applied to the input terminals and the control terminals of the first reset transistors Qr1 and the input terminals of the output transistors Qs, and voltages of which each has a low voltage, for example gate-off voltages Voff, are applied to the input terminals and the control terminals of the second reset transistors Qr2. Thereby, the first reset transistors Qr1 and the output transistors Qs are turned on.

Next, a test signal is applied to the inspection pad IP3 using the test apparatus, to turn on the switching elements $TY_1$-$TY_N$ and $TX_1$-$TX_M$.

Thereby, the gate-on voltages Von through the respective turned-on output transistors Qs are applied to the image scanning lines $G_1$-$G_n$ and the image data lines $D_1$-$D_m$ through the respective turned-on switching elements $TY_1$-$TY_N$ and $TX_1$-$TX_M$, respectively as gate-on voltages of the switching elements Q and data signals of the image data lines $D_1$-$D_m$, to operate the pixels PX.

At this time, when the first reset transistors Qr1 or the output transistors Qs of the sensor signal output units SOUT connected to the horizontal sensor data lines $SY_1$-$SY_N$ are abnormal, the gate-on voltages are not applied to the corresponding image scanning lines $G_1$-$G_n$ such that the corresponding pixels PX are not operated. Furthermore, when the first reset transistors Qr1 or the output transistors Qs of the sensor signal output units SOUT connected to the vertical sensor data lines SX-$SX_M$ are abnormal, the gate-on voltages are not applied to the corresponding image data lines $G_1$-$G_n$ as data signals such the corresponding pixel columns represent different brightness from normal pixel columns.

Thereby, the inspector examines the pixel operation status or the display status such as for brightness of pixels by eye to check states the sensor signal output units SOUT or sensor data lines $SY_1$-$SY_N$ and $SX_1$-$SX_M$, and then stops the application of the test signal.

Next, operations for inspecting states of the second reset transistors Qr2 of the sensor signal output units SOUT will be described.

Using the test apparatus, the voltages applied to the input terminal and the control terminal of the first reset transistors Qr1 are changed into the gate-off voltages Voff of a low level, and the gate-on voltages Von of a high level are applied to the input terminals of the output transistors Qs. The gate-on voltages Von are also applied to the input terminals and the control terminals of the second reset transistors Qr2.

Thereby, the first reset transistors Qr1 are turned off, and the second reset transistors Qr2 and the output transistors Qs are turned on. At this time, it is assumed that the output transistors Qs are normal because of the VI performed previously.

Next, using the test apparatus, a test signal for turning on the inspection switching elements $TY_1$-$TY_N$ and $TX_1$-$TX_M$ is applied to the inspection pad IP3.

Thereby, pixels PX operate by signals applied to the respective image scanning lines $G_1$-$G_n$ and the image data lines $D_1$-$D_m$ through the turned-on switching elements $TY_1$-$TY_N$ and $TX_1$-$TX_M$.

At this time, when the second reset transistors Qr2 of the sensor signal output units SOUT connected to the horizontal sensor data lines $SY_1$-$SY_N$ are abnormal, the output transistors Qs are not turned on such that the gate-on voltages are not applied to the corresponding image scanning lines $G_1$-$G_n$, and thereby the pixels PX of the corresponding pixel rows are not operated.

Furthermore, when the second reset transistors Qr2 of the sensor signal output units SOUT connected to the vertical sensor data lines SX-$SX_M$ are abnormal, the gate-on voltages are not applied to the corresponding image data lines $G_1$-$G_n$, and thereby the corresponding pixel columns represent different brightness from normal pixel columns.

Thereby, the inspector examines the pixel operation status or the display status such as for brightness of pixels by eye to check states of the output transistors Qs of the sensor signal output units SOUT, and then stops the application of the test signal.

When the VI is finished for all the sensor signal output units SOUT, the single chip 610 is mounted on the LC panel assembly. Then, the single chip 610 outputs a switching element off voltage Vss through the output pad VP. The switching element off voltage Vss is applied to the inspection lines L2 and L3 through the signal line L1 and the inspection pad IP3 such that the switching elements $TY_1$-$TY_N$ and $TX_1$-$TX_M$ maintain the turned-off state. Thereby, the pixels PX are operated by the controlling of the single chip 610.

Next, referring to FIG. 9, a VI method of the sensor signal output units SOUT according to another exemplary embodiment of the present invention will be described.

Figure 9:
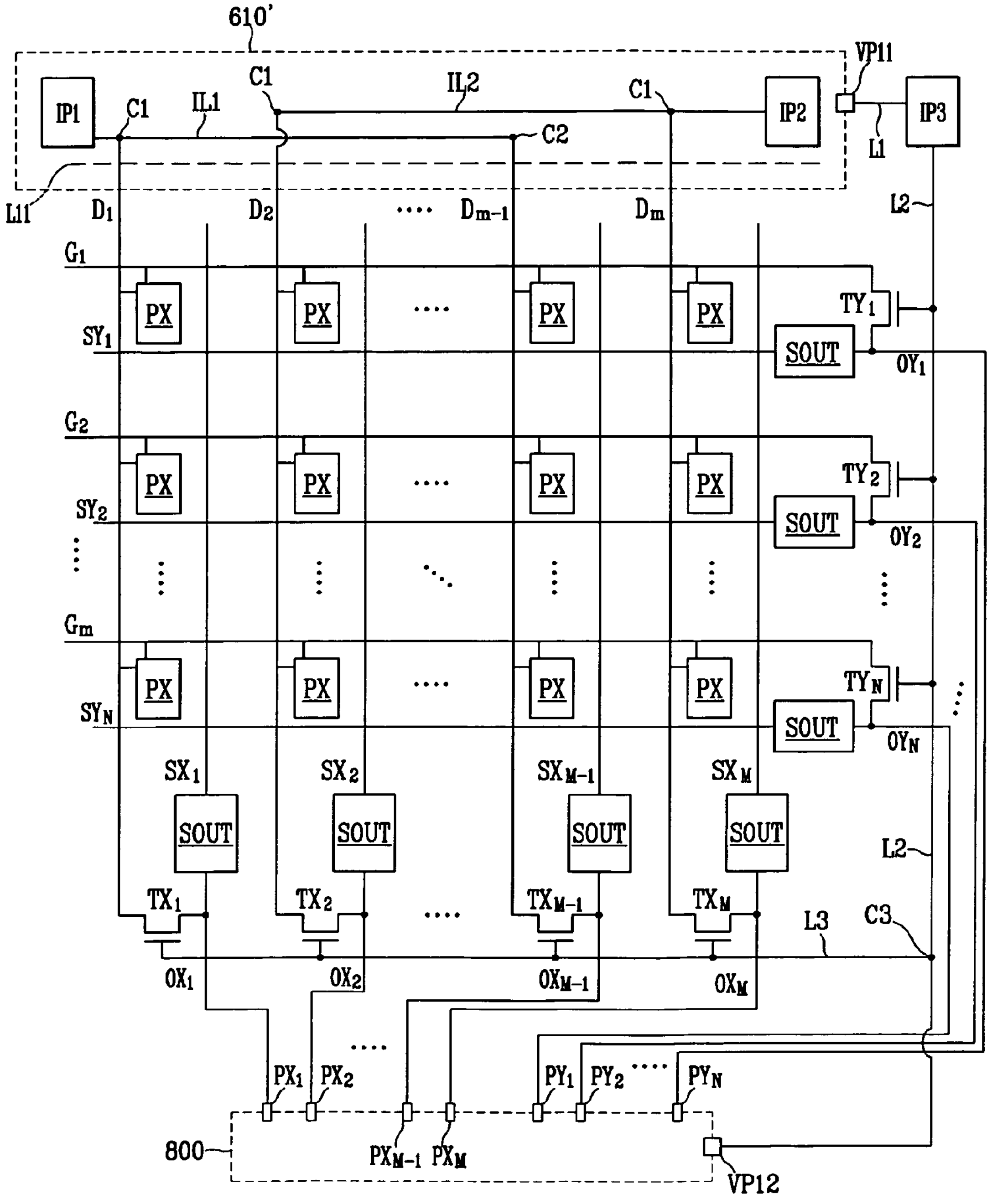
FIG. 9 is a schematic layout view of an LC panel assembly on which a plurality of inspection switching elements, a plurality of inspection lines, and a plurality of inspection pads for inspecting a sensor signal output unit are formed according to another exemplary embodiment of the present invention.

FIG. 9 is a schematic layout view of an LC panel assembly on which a plurality of inspection switching elements, a plurality of inspection lines, and a plurality of inspection pads for inspecting a sensor signal output unit are formed according to another exemplary embodiment of the present invention.

As compared with FIG. 8, a sensing signal processor 800 in FIG. 9 is not integrated on the single chip 610', but is manufactured as a separate chip to be mounted on the LC panel assembly. Thereby, as shown in FIG. 9, the input pads $PY_1$-$PY_N$ and $PX_1$-$PX_M$ are formed on the sensing signal processor 800, of which each is connected to a corresponding output data line $OY_1$-$OY_N$ and $OX_1$-$OX_M$. Furthermore, as compared with FIG. 8, an output pad VP12 is further formed under the single chip 610', as well as an output pad VP11 for outputting a switching element off voltage Vss to the inspection pad IP3. The output pad VP12 transmits the switching element off voltage Vss to an inspection line L2. Except for the above description, the construction shown in FIG. 9 is substantially the same as that shown in FIG. 8, and thereby the elements performing the same operations are indicated as the same reference numerals, and a detailed description thereof is omitted.

Next, a VI method for inspecting states of the sensor signal output units SOUT will be described. The VI method according to another exemplary embodiment of the present invention is very similar to the VI method described with reference to FIG. 8.

As above-described, in a state in which the single chip 610' and the sensing signal processor 800 are not mounted on the LC panel assembly, after inspecting the states of the pixels PX, the image scanning lines $G_1$-$G_n$, and the image data lines $D_1$-$D_m$ using a VI method, the inspection lines IL1 and IL2 connected between the inspection pads IP1 and IP2 and the image data lines $D_1$-$D_m$ are cut along the cutting line L11 using an appropriate apparatus such as a laser trimming device.

Next, an inspecting method to the sensor signal output units SOUT will be described.

First, operations for inspecting states of the first reset transistors Qr1 and the output transistors Qs of the sensor signal output units SOUT will be described.

Using a test apparatus, gate-on voltages of a high level are applied to the input terminals and the control terminals of the first reset transistors Qr1 and the input terminals of the output transistors Qs such that the first reset transistors Qr1 and the output transistors Qs are turned on, and gate-off voltage of a low level are applied to the input terminals and the control terminals of the second reset transistors Qr2 such that the second reset transistors Qr2 are turned off.

Next, a test signal is applied to the inspection pad IP3 using the test apparatus, to turn on the switching elements $TY_1$-$TY_N$ and $TX_1$-$TX_M$.

Thereby, the gate-on voltages Von through the respective turned-on output transistors Qs are applied to the image scanning lines $G_1$-$G_n$ and the image data lines $D_1$-$D_m$ through the respective turned-on switching elements $TY_1$-$TY_N$ and $TX_1$-$TX_M$, respectively, to operate the pixels PX.

That is, when the first reset transistors Qr1 or the output transistors Qs of the sensor signal output units SOUT connected to the horizontal sensor data lines $SY_1$-$SY_N$ are abnormal, the corresponding pixels PX are not operated. Furthermore, when the first reset transistors Qr1 or the output transistors Qs of the sensor signal output units SOUT connected to the vertical sensor data lines SX-$SX_M$ are abnormal, the corresponding pixel columns represent different brightness from normal pixel columns.

Thereby, the inspector examines the pixel operation status or the display status such as for brightness of pixels by eye to check states the first reset transistors Qr1 or the output transistors Qs, and then stops the application of the test signal that is applied to the sensor signal output units SOUT and the inspection pad IP3.

Next, operations for inspecting states of the second reset transistors Qr2 of the sensor signal output units SOUT will be described.

Using the test apparatus, the gate-off voltages of a low level are applied to the input terminal and the control terminal of the first reset transistors Qr1, and the gate-on voltages Von of a high level are applied to the input terminals of the output transistors Qs. The gate-on voltages Von are also applied to the input terminals and the control terminals of the second reset transistors Qr2.

Thereby, the first reset transistors Qr1 are turned off, and the second reset transistors Qr2 and the output transistors Qs are turned on. At this time, it is assumed that the output transistors Qs are normal.

Next, using the test apparatus, a test signal for turning on the inspection switching elements $TY_1$-$TY_N$ and $TX_1$-$TX_M$ is applied to the inspection pad IP3.

Thereby, pixels PX operate by signals applied to the respective image scanning lines $G_1$-$G_n$ and the image data lines $D_1$-$D_m$ through the turned-on switching elements $TY_1$-$TY_N$ and $TX_1$-$TX_M$.

At this time, when the second reset transistors Qr2 of the sensor signal output units SOUT connected to the horizontal sensor data lines $SY_1$-$SY_N$ are abnormal, the pixels PX of the corresponding pixel rows are not operated, and when the second reset transistors Qr2 of the sensor signal output units SOUT connected to the vertical sensor data lines SX-$SX_M$ are abnormal, the corresponding pixel columns represent different brightness from normal pixel columns.

Thereby, the inspector examines the pixel operation status or the display status such as for brightness of pixels by eye to check states of the output transistors Qs of the sensor signal output units SOUT, and then stops the application of the test signal.

When the VI is finished for all the sensor signal output units SOUT, the single chip 610' and the sensing signal processor 800 are mounted on the LC panel assembly. Then, the single chip 610' and the sensing signal processor 800 output a switching element off voltage Vss through the output pads VP11 and VP12, respectively. The switching element off voltage Vss is applied to the inspection lines L2 and L3 through the signal line L1 and the inspection pad IP3 such that the switching elements $TY_1$-$TY_N$ and $TX_1$-$TX_M$ maintain the turned-off state. Thereby, the pixels PX are normally operated by the controlling of the single chip 610' and the sensing signal processor 800, etc.

Next, referring to FIG. 10, when the concentrations of the pixels and the sensing units are different, a connection between the inspection switching elements and the image scanning and image data lines will be described.

Figure 10:
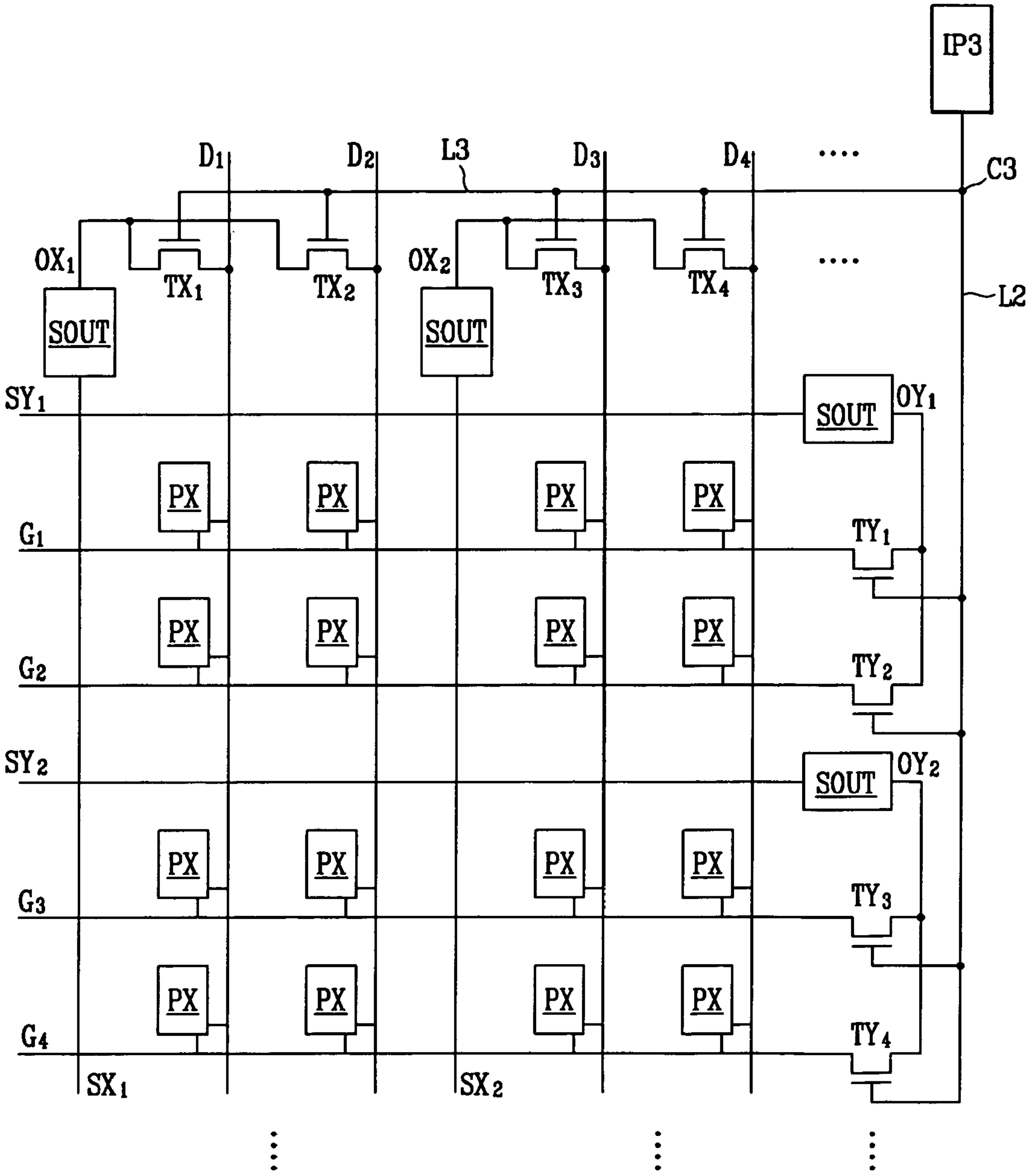
FIG. 10 is an equivalent circuit diagram illustrating a connection between the inspection switching elements and the image scanning and image data lines when the concentrations of the pixels and the sensing units are different, in testing the sensor signal output units according to embodiments of the present invention.

FIG. 10 is an equivalent circuit diagram illustrating a connection between the inspection switching elements and the image scanning and image data lines when the concentrations of the pixels and the sensing units are different, in testing the sensor signal output units according to embodiments of the present invention.

As shown in FIG. 10, the concentration of the sensing units SU is less than that of the pixels PX such that sensor data lines $SX_1$, $SX_2$, . . . , $SY_1$, $SY_2$, . . . are disposed for each predetermined of number pixel rows and columns, for example every two successive pixel rows (hereinafter referred to as "a pixel row group") and two successive pixel columns (hereinafter referred to as "a pixel column group"). In this case, the inspection switching elements $TX_1$-$TX_M$ have the output terminals connected to the respective image data lines $D_1$-$D_m$ and the control terminals connected to the inspection line L3, and the inspection switching elements $TY_1$-$TY_N$ have the output terminals connected to the respective image data lines $G_1$-$G_n$ and the control terminals connected to the inspection line L2. That is, the switching elements $TY_1$-$TY_N$ and $TX_1$-$TX_M$ are respectively connected to one image scanning line $G_1$-$G_n$ and one image data lines $D_1$-$D_m$.

However, the switching elements $TX_1$-$TX_M$ and $TY_1$-$TY_N$ included in the same pixel row groups and the same pixel column groups are respectively connected to the same output data lines $OX_1$-$OX_M$ and $OY_1$-$OY_N$, through the output terminals. For example, as shown in FIG. 10, the switching elements $TX_1$ and $TX_2$ connected to the first and second image data lines $D_1$ and $D_2$ are connected to the output data line $OX_1$, and the switching elements $TX_3$ and $TX_4$ connected to the third and fourth image data lines $D_3$ and $D_4$ are connected to the output data line $OX_2$. In addition, the switching elements $TY_1$ and $TY_2$ connected to the first and second image scanning lines $G_1$ and $G_2$ are connected to the output data line $OY_1$, and the switching elements $TY_3$ and $TY_4$ connected to the third and fourth image scanning lines $G_3$ and $G_4$ are connected to the output data line $OY_2$.

In FIG. 10, the sensor data lines $SX_1$-$SX_M$ are located on the left side of the pixel column groups, but they may be located on the right side, and the sensor data lines $SY_1$-$SY_N$) are located on the upper side of the pixel row groups, but they may be located on the lower side of the pixel row groups. Alternatively, the sensor data lines $SX_1$-$SX_M$ and $SY_1$-$SY_N$ may be located with shapes different from those shown in FIG. 10.

Thereby, in performing the VI of the sensor signal output units SOUT, a signal from one sensor signal output unit SOUT is applied to a plurality of image scanning signals or image data lines included in the same pixel row group and the same pixel column group through the respective inspection switching elements to make the pixels operate for VI.

When one sensor signal output unit SOUT is abnormal, the pixels included in the corresponding pixel row group or the corresponding pixel column group do not normally operate such that an inspector determines that the sensor signal output unit SOUT connected to the pixel row group or the pixel column group is in an abnormal state.

In FIG. 10, one sensor line is disposed every two pixel rows and pixel columns, but may be disposed every three or more pixel rows and columns.

In the embodiments, as one example of the sensing unit, the sensor unit is formed by a variable capacitor and a reference capacitor, but may be formed with different types thereof.

Furthermore, an LCD is described in the embodiments of the present invention as one example of a display device, but the present invention may be apply to flat display devices such as a plasma display device or an organic light emitting diode (OLED) display, etc.

Accordingly to the present invention, by forming the inspection switching elements, the sensor signal output units outputting the sensor data signals are visual inspected before costly driving ICs are mounted. Thereby, waste of the costly driving ICs due to the abnormal sensor signal output units decreases such that a manufacturing cost is saved and a defect rate of the display devices is reduced.

While the present teachings of invention have been provided with reference to exemplary embodiments, it is to be understood that various modifications and equivalent arrangements will be apparent to those skilled in the pertinent art after having read the present disclosure and that such various modifications may be made without, however, departing from the spirit and scope of the teachings.

What is claimed is:

1. A display device comprising:

a plurality of first display signal lines;

a plurality of second display signal lines intersecting the first display signal lines;

a plurality of pixels connected to one of the first display signal lines and one of the second display signal lines, respectively;

a plurality of first sensor signal lines respectively disposed at predetermined pixel rows (hereinafter referred to as "a pixel row group") and parallel to the first display signal lines;

a plurality of second sensor signal lines respectively disposed at predetermined pixel columns (hereinafter referred to as "a pixel column group") and parallel to the second display signal lines;

a plurality of first sensor signal output units respectively connected to the first sensor signal lines;

a plurality of second sensor signal output units respectively connected to the second sensor signal lines;

a plurality of first inspection switching elements respectively connected to the first display signal lines;

a plurality of second inspection switching elements respectively connected to the second display signal lines;

a first inspection line for transmitting a first test signal from the outside to the first inspection switching elements; and a second inspection line for transmitting the first test signal to the second inspection switching elements, wherein the first inspection switching elements connected to the first display signal lines included in the same pixel row" group are connected to the same first sensor signal output unit, and the second inspection switching elements connected to the second display signal lines included in the same pixel column group are connected to the same second sensor signal output unit.

2. The display device of claim 1, wherein the first inspection line comprises an inspection pad for receiving the first test signal.

3. The display device of claim 2, further comprising a signal line connected to the inspection pad and transmitting a driving voltage and a first output pad connected to the signal line.

4. The display device of claim 3, further comprising a driving chip electrically connected to the second display signal lines, the first sensor signal lines, and the second sensor signal lines.

5. The display device of claim 4, wherein the first output pad is connected to the driving chip, and the driving voltage turns off the first inspection switching elements and the second inspection switching elements.

6. The display device of claim 4, further comprising one or more third inspection lines disposed outside of an area of the plurality of pixels, wherein the one or more third inspection lines transmit a second test signal to the second display signal lines, and wherein the one or more third inspection lines each comprises an inspection pad for receiving the second test signal.

7. The display device of claim 6, wherein a number of the one or more third inspection lines is two and each of the two third inspection lines comprises an inspection pad, and wherein the two third inspection lines are alternately connected with the second display signal lines.

8. The display device of claim 3, further comprising a first driving chip electrically connected to the second display signal lines and a second driving chip electrically connected to the first sensor signal lines and the second sensor signal lines.

9. The display device of claim 8, further comprising a second output pad connected to the first inspection line and transmitting the driving voltage.

10. The display device of claim 9, wherein the second output pad is connected to the second driving chip, and the driving voltage turns the first switching inspection elements and the second inspection switching elements off.

11. The display device of claim 8, further comprising one or more third inspection lines disposed outside of an area of the plurality of pixels and transmitting a second test signal to the second display signal lines; wherein the one or more third inspection lines each comprises an inspection pad for receiving the second test signal.

12. The display device of claim 11, wherein a number of the one or more third inspection lines is two, and each of the two third inspection lines comprises an inspection pad, and the two third inspection lines are alternately connected with the second display signal lines.

13. The display device of claim 1, wherein each of the first sensor signal output units and the second sensor signal output units comprises:

a first reset transistor supplied with a first reset voltage and a first reset control signal;

an output transistor connected to the first reset transistor and the first inspection switching element or the second inspection switching element; and a second reset transistor supplied with a second reset voltage and a second reset control signal and connected to the output transistor.

14. A method for testing a display device, which comprises a plurality of first display signal lines, a plurality of second display signal lines, a plurality of pixels connected to the first display signal lines and the second display signal lines, a plurality of first sensor signal lines disposed for each predetermined number of pixel rows, a plurality of second sensor signal lines disposed for each predetermined number of pixel columns, a plurality of first sensor signal output units connected to the first sensor signal lines, a plurality of second sensor signal output units connected to the second sensor signal lines, a plurality of first inspection switching elements respectively connected to the first display signal lines, a plurality of second inspection switching elements respectively connected for inspecting connections to the second display signal lines, a first inspection line for transmitting a test signal from the outside to the first inspection switching elements, and a second inspection line for transmitting the test signal to the second inspection switching elements, wherein each of the first and second sensor signal output units comprises a first reset transistor, an output transistor connected to the first reset transistor, and a second reset transistor connected to the output transistor, the method comprising:

driving the first reset transistor and an output transistor;

driving pixels by applying a test signal to the first inspection line and the second inspection line and applying a signal from the output transistor to the first display signal lines and the second display signal lines displays through the first and second inspection switching elements;

stopping the driving of the first reset transistor;

driving the second reset transistor; and driving pixels by applying a test signal to the first inspection line and the second inspection line and applying a signal from the output transistor to the first display signal lines and the second display signal lines through the first and second inspection switching elements.

* * * * *